United States Patent [19]

Stevens

[11] 4,075,561
[45] Feb. 21, 1978

[54] PROGRAMMABLE ELECTRICAL APPARATUS CONTAINING A BATTERY

[75] Inventor: Francis Joseph Stevens, North Berwick, Maine

[73] Assignee: General Electric Company, New York, N.Y.

[21] Appl. No.: 737,675

[22] Filed: Nov. 1, 1976

[51] Int. Cl.² ............... G01R 1/04; G01R 35/04; G01R 1/20
[52] U.S. Cl. .................... 324/149; 324/74; 324/156
[58] Field of Search ......... 324/149, 156, 157, 73, 324/29.5, 74, 137; 361/369, 372–375

[56] References Cited
U.S. PATENT DOCUMENTS

| | | | |
|---|---|---|---|
| 1,918,940 | 7/1933 | Triplett | 324/156 |
| 2,640,099 | 5/1953 | Hull | 324/149 X |
| 3,061,779 | 10/1962 | Boswell et al. | 324/156 X |
| 3,879,655 | 4/1975 | Saito | 324/29.5 |

Primary Examiner—Gerard R. Strecker
Attorney, Agent, or Firm—R. G. Simkins; P. L. Schlamp; F. L. Neuhauser

[57] ABSTRACT

An electrical apparatus enclosed within a housing which contains a replaceable battery, and is provided with means for programming and/or testing by means of connectable electrical contacts with an independent instrument. The electrical apparatus is provided with a composite unit comprising a battery support and an electrical terminal connector which is arranged to cooperate with a single small access port in the apparatus housing whereby routine servicing of battery replacements, programming and/or testing, can be performed through the single port.

6 Claims, 2 Drawing Figures

PROGRAMMABLE ELECTRICAL APPARATUS CONTAINING A BATTERY

BACKGROUND OF THE INVENTION

This invention relates to electrical apparatus, such as electrical meters or power monitoring devices, and comprises a unique and advantageous construction therefor. Electrical apparatus such as meters or monitors frequently contain batteries for their temporary or emergency operation during power outages, and which require periodic replacement. Additionally, some of the more sophisticated apparatus of this type currently available include integral electrical programming and/or testing systems whereby predetermined plans or schemes of performance conditions, and/or evaluating test procedures, can be programmed into the apparatus by means of externally applied electrically transmitted instructions and activation. For instance, an independent programming or testing instrument is temporarily connected with the apparatus through electrical contacts, and a programmed scheme is established in the apparatus, and/or its operation is evaluated, through electrical currents or impulses transmitted therebetween.

SUMMARY OF THE INVENTION

This invention comprises a new and advantageous construction for electrical apparatus which contain replaceable batteries and are electrically programmable and/or are testable through temporary electrical connections with an external instrument. The invention includes a composite battery support and an electrical terminal connector unit arranged in concentric alignment with a single access port in the apparatus housing, whereby all routine servicing operations for the apparatus can be performed by entry through the same or sole port.

The invention is particularly directed to and useful in electrical apparatus such as watthour meters for measuring and recording electrical power consumption. Watthour meters which record residential or commercial power consumption for purposes of billing by a utility, are commonly installed in exterior locations to facilitate their accessibility for reading by utility personnel. Thus, the apparatus housing or enclosure must be completely weather-proof to protect the electrical components, as well as tamper-proof to preclude acts of vandalism or fraululent alterations in its readings.

Accordingly, an increase in the number of access ports or entries in the apparatus housing for service, not only increases manufacturing costs, but also adds to the effort and expense of securing the access ports or entries against weather and tampering in the performance of routine servicing.

OBJECTS OF THE INVENTION

It is a primary object of this invention to provide an electrically programmable or testable apparatus having a replaceable battery which is of an improved and advantageous construction that is more economical and efficient to produce and service.

It is also an object of this invention to provide an improved electrical apparatus containing a replaceable battery and an internal electrically programming or test system that is motivated by temporary electrical connections from an external instrument, and which can be serviced by means of a single access port or entry in the housing therefor.

It is a further object of this invention to provide an enclosed electrical apparatus of a unique construction comprising a composite unit of a battery support and an electrical terminal connector arranged and aligned approximately concentrically and within the circumferential area of the periphery of a service entry or access port in the enclosure of the apparatus, whereby replacement of the battery and/or electrical programming or testing of the apparatus can be achieved through a single service entry or access port.

It is an additional object of this invention to provide a new and improved construction for watthour meters utilizing replaceable batteries and electrically programmable and/or testable systems which are periodically activated by temporary electrical contact with said external instruments, and require only a single access port or entry in the meter housing for routine service comprising battery replacement, programming and/or testing.

DESCRIPTION OF A PREFERRED EMBODIMENT

Figure 1:
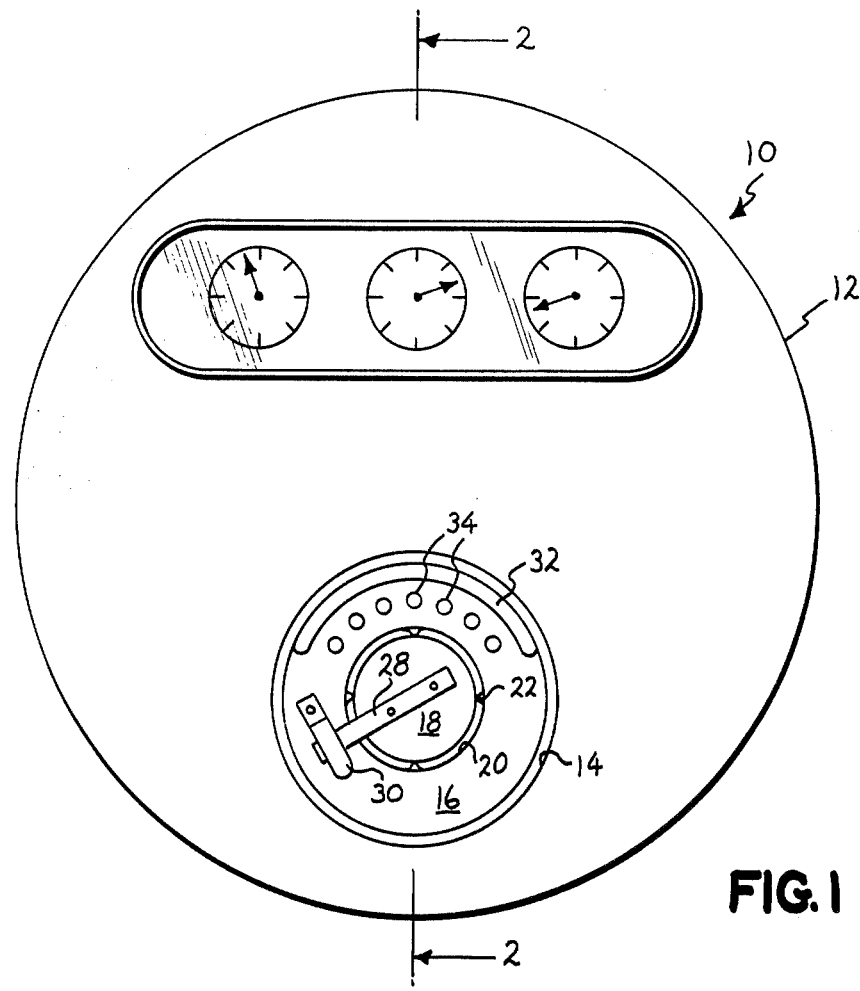
FIG. 1 of the drawing is a front view of a portion of an electrical apparatus, such as a watthour meter, comprising the construction of this invention.
Figure 2:
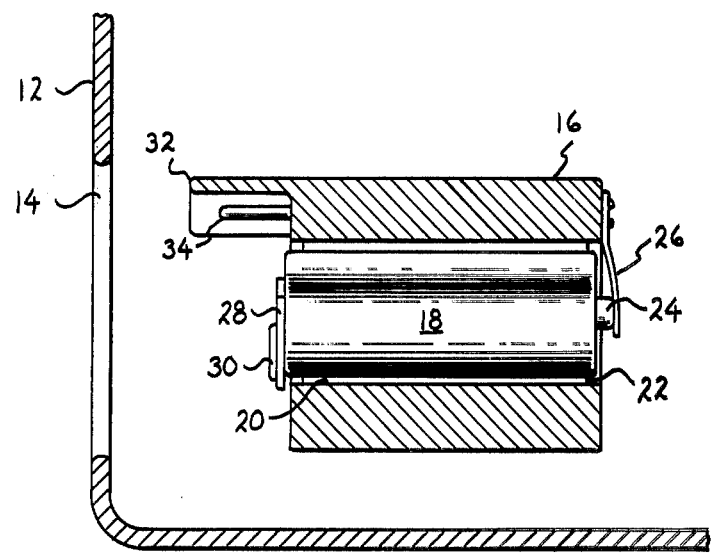
FIG. 2 of the drawing is side view of a portion of the apparatus of FIG. 1, with a part thereof in cross-section taken along lines 2—2 of FIG. 1, and illustrates the construction of the invention.

Referring to the drawing, an electrical apparatus 10, such as a watthour meter for measuring and recording electrical power consumed, is enclosed within a protective housing or cover 12 in a conventional manner. Apparatus housing 12 is provided with an access port or service entry 14 for purposes of routine servicing or maintenance. The access port or entry 14 is aptly located in apparatus housing 12 so as to compliment the interior mechanism or components of the apparatus which require periodic routine service, such as batteries and programming or testing systems.

In accordance with this invention, a composite unit of multi-purpose structure provides the dual functions of battery support and terminal connector, and is appropriately arranged within the apparatus housing to cooperate with the access port or service entry 14 in the housing 12 of the apparatus 10.

Composite unit 16 of the invention includes an integral structure containing a support or receptacle for a battery, such as dry cell battery 18, which may comprise a hollow cylinder or tubular body providing a receptacle or chamber 20, or other appropriate structure for the retainment of a battery in its designated position within the apparatus and in electrical contact with the terminals therefor. In the particular embodiment shown in the drawing, battery chamber 20 is provided with a plurality of longitudinal spacing ribs 22 for the support thereon of the battery contained within the chamber 20.

The composite unit 16, containing the battery supporting chamber 20, is aptly provided with suitable terminals and power leads for making electrical connections from the terminal posts of a battery residing therein to the components of the apparatus. For example, a terminal post 24 of the battery abuts connecting terminal 26, and the other terminal post 28 of the battery abuts connecting terminal 30. To securely fix battery 18 into position and assure good electrical contact of its terminal posts with the connecting terminals of the apparatus, connecting terminal 26 can be spring biased or loaded, and battery terminal post 28 and connecting terminal 30 of the unit 16 can be arranged to function or cooperate together as a bayonet-type locking mechanism, as shown in the drawing.

Specifically, the battery terminal post 28 is provided as a bar affixed to the base of the battery projecting radially outward beyond the periphery of the battery. Additionally, connecting terminal 30 of the unit 16 is provided by an arm secured at one end to the unit, and the other end thereof is spaced outward from the unit, but extending generally parallel thereto. Thus, a battery with a projecting terminal post bar 28 can be moved into position in the receptacle therefor with its projecting bar bypassing the connecting terminal arm 30, then rotated in a manner to move the radially projecting post bar 28 under the end of terminal arm 30, or between it and the structure of unit 16, as shown in the drawing. This bayonet-type locking mechanism effectively secures the battery with its terminal posts fixed in electrical contact with the corresponding terminal connections.

Composite unit 16, containing the battery supporting chamber 20, is also provided with an integral terminal coupling connector 32, comprising a bank of individual electrical terminals 34, such as a plurality of electrically conductive prongs or plugs as shown in the drawing, or alternatively a plurality of electrically conductive sockets or jacks adapted to mate in electrical contact with an appropriate counterpart of the sockets or jacks with prongs or plugs in a portable terminal coupling member (not shown).

The number and physical arrangement of the electrical terminals 34, and their type such as male or female, of the connector 32, are provided in accordance with the specific programming and/or testing requirements of the particular apparatus, whereby they mate in electrical contact with their corresponding counterparts in a portable terminal coupling member of an appropriate external programming and/or testing instrument (not shown). However, in a preferred embodiment of the invention, the terminals 34 of the integral terminal connector 32, are arranged in an arcuate or semicircular peripheral pattern in or on the structure of unit 16 about the battery support chamber 20, or its end, as shown in the drawing, to provide a maximum consolidation of the area of the components and saving in space.

The battery support, or chamber 20, and peripherally arranged terminal connector 32, which are integrally formed in the composite unit 16 of the apparatus 10, are positioned inside the housing 12, spaced therefrom, aligned approximately concentrically with the access post or service entry 14. Additionally, both the battery support or chamber and the terminal connector are located completely within a circumferential area which is smaller than the periphery of the access port or service entry 14, substantially as shown in the drawing.

The above described construction of this invention in an apparatus such as a watthour meter, enables an operator to perform all routine service, including replacement of batteries, or electrically programming and/or testing of the apparatus with an external instrument, through a single access port or entry. For example, the concentrically aligned arrangement of both integral components of the composite unit within a circumferential area smaller than the periphery of the access port or service entry permits a service operator to remove exhausted batteries and install replacement batteries through the same access port or service entry which is used for the introduction or passage therethrough of a portable terminal coupling member of an external programming and/or testing instrument for making electrical connections with the integral terminal connector or the apparatus. Thus, the construction of this invention requires only a single access port or service entry in the apparatus housing for the performance of routine service involving more than one function. Accordingly, both the initial manufacturing costs for the apparatus, and the effort and expense of securing access ports or entries against weather and vandalism in the performance of routine servicing, are minimized by the new construction of this invention.

In the hereinafter appended claims, the terms "programmable" or "Programming instrument" are intended to include the function of testing or evaluating the performance or operating condition of the apparatus and testing instruments therefor.

Although the invention has been described with reference to certain specific embodiments thereof, numerous modifications are possible and it is desired to cover all modifications falling within the spirit and scope of this invention.

What I claim as new and desire to secure by Letters Patent of the United States is:

1. A programmable electrical apparatus containing a replaceable battery, comprising:
   a. an electrical apparatus containing a replaceable battery and having an electrically programmable system therein;
   b. a housing for enclosing said apparatus having a small access port therein for the installation and removal of replacement batteries and the insertion of a terminal coupling member of a programming instrument; and
   c. a composite unit including an integral battery supporting receptacle and an integral electrical terminal connector for making electrical contact with a terminal coupling member of a programmable instrument, said battery supporting receptacle and terminal connector of the unit being positioned inside the housing of the apparatus concentrically aligned with the access port of the housing and within a circumferential area smaller than the periphery of the access port, whereby replacement batteries can be installed through said access port in the housing and into the integral battery support receptacle and a terminal connecting member of a programming instrument can be inserted through said access port in the housing for mating in electrical contact with the integral terminal connector of the apparatus.

2. The programmable electrical apparatus of claim 1, wherein the integral electrical terminal connector comprises a bank of individual electrical terminals.

3. A programmable electrical apparatus containing a replaceable battery, comprising:
   a. an electrical apparatus containing a replaceable battery and having an electrically programmable system therein;
   b. a housing for enclosing said apparatus having a single small access port therein for the installation and removal of replacement batteries and the insertion of a terminal coupling member of a programming instrument; and c. a composite structural unit including an integral battery supporting receptacle and an integral electrical terminal connector having a plurality of individual electrical terminals arranged about the battery support receptacle for making electrical contact with a terminal coupling member of a programming instrument, said battery supporting receptacle and plurality of individual electrical terminals of the electrical terminal connector of the unit being positioned inside the housing of the apparatus concentrically aligned with the access port of the housing and within a circumferential area smaller than the periphery of the access port, whereby replacement batteries can be installed through said access port in the housing and into the integral battery support receptacle and a terminal connecting member of a programming instrument can be inserted through said access port in the housing for mating in electrical contact with the integral terminal connector of the apparatus.

4. The programmable electrical apparatus of claim 3, wherein the integral electrical terminal connector comprises an arcuate bank of individual electrical terminals arranged in a peripheral pattern about the battery support receptacle.

5. A programmable, electrical watthour meter apparatus containing a replaceable battery, comprising:

a. an electrical watthour meter containing a replaceable battery and having an electrically programmable system therein;

b. a housing for enclosing said watthour meter having a single small access port therein for the installation and removal of replacement batteries and the insertion of a terminal coupling member of a programming instrument; and c. A composite structural unit including an integral battery supporting receptacle and an integral electrical terminal connector having a plurality of individual electrical terminals arranged about the battery support receptacle for making electrical contact with a terminal coupling member of a programming instrument, said battery supporting receptacle and plurality of individual electrical terminals of the electrical terminal connector of the unit being positioned inside the housing of the watthour meter concentrically aligned with the access port of the housing and within a circumferential area smaller than the periphery of the access port, whereby replacement batteries can be installed through said access port in the housing and into the integral battery support receptacle and a terminal connecting member of a programming instrument can be inserted through said access port in the housing for mating in electrical contact with the integral terminal connector of the watthour meter.

6. The programmable electrical watthour meter apparatus of claim 5, wherein the integral electrical terminal connector comprises an arcuate bank of individual electrical terminals arranged in a peripheral pattern about the battery support receptacle.

* * * * *